United States Patent
Li

(10) Patent No.: US 7,009,307 B1
(45) Date of Patent: Mar. 7, 2006

(54) LOW STRESS AND WARPAGE LAMINATE FLIP CHIP BGA PACKAGE

(75) Inventor: Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/849,651

(22) Filed: May 19, 2004

Related U.S. Application Data

(63) Continuation-in-part of application No. 10/305,671, filed on Nov. 25, 2002.

(51) Int. Cl.
H01L 23/48 (2006.01)
H01L 23/52 (2006.01)
H01L 29/40 (2006.01)

(52) U.S. Cl. .............. 257/783; 257/707; 438/118
(58) Field of Classification Search .......... 257/706, 257/707, 704, 710, 713, 783, 782; 438/122, 438/118
See application file for complete search history.

(56) References Cited

U.S. PATENT DOCUMENTS

| | | | |
|---|---|---|---|
| 5,015,803 A * | 5/1991 | Mahulikar et al. | 174/52.4 |
| 5,909,056 A | 6/1999 | Mertol | |
| 6,015,722 A * | 1/2000 | Banks et al. | 438/108 |
| 6,091,603 A | 7/2000 | Daves et al. | |
| 6,103,550 A | 8/2000 | Camenforte et al. | |
| 6,104,093 A * | 8/2000 | Caletka et al. | 257/778 |
| 6,262,489 B1 | 7/2001 | Koors et al. | |
| 6,472,762 B1 * | 10/2002 | Kutlu | 257/778 |
| 6,504,242 B1 | 1/2003 | Deppisch et al. | |
| 6,566,748 B1 * | 5/2003 | Shimizu et al. | 257/704 |
| 6,617,683 B1 * | 9/2003 | Lebonheur et al. | 257/707 |
| 6,621,160 B1 * | 9/2003 | Shibamoto et al. | 257/712 |
| 6,744,132 B1 | 6/2004 | Alcoe et al. | |
| 6,756,685 B1 | 6/2004 | Tao | |
| 6,773,963 B1 | 8/2004 | Houle | |
| 6,784,535 B1 | 8/2004 | Chiu | |
| 6,784,541 B1 * | 8/2004 | Eguchi et al. | 257/723 |
| 6,909,176 B1 * | 6/2005 | Wang et al. | 257/706 |
| 2004/0016996 A1 | 1/2004 | Tang | |
| 2004/0150118 A1 * | 8/2004 | Honda | 257/778 |
| 2004/0155358 A1 | 8/2004 | Iijima | |
| 2004/0188862 A1 | 9/2004 | Nagarajan et al. | |

OTHER PUBLICATIONS

U.S. Appl. No. 10/305,671 filed on Nov. 25, 2002 entitled "Flip Chip Package With Warpage Control".
U.S. Appl. No. 10/719,451 filed Nov. 20, 2003 entitled "Structure And Material For Assembling A Low-K Si Die To Achieve A Low Warpage And Industrial Grade Reliability Flip Chip Package With Organic Substrate".
Office Action, 12 page document dated Oct. 20, 2004, U.S. Appl. No.: 10/305,671.

* cited by examiner

*Primary Examiner*—S. V. Clark
(74) *Attorney, Agent, or Firm*—Beyer Weaver & Thomas, LLP

(57) ABSTRACT

Provided are a semiconductor die flip chip package with warpage control and fabrication methods for such packages. The packages include heat spreaders that are attached to the die and packaging substrate. In general, the modulus of the adhesive, which is used to attach the heat spreader to the substrate, is selected to provide a relatively "soft" connection. The result is a package with less bowing and so improved co-planarity (e.g., in compliance with industry specifications) with the surface to which it is ultimately bound. Moreover, the die and package reliabilities are thereby enhanced.

33 Claims, 2 Drawing Sheets

LOW STRESS AND WARPAGE LAMINATE FLIP CHIP BGA PACKAGE

RELATED APPLICATIONS

This application is a continuation-in-part of U.S. patent application Ser. No. 10/305,671, filed on Nov. 25, 2002, and entitled "FLIP CHIP PACKAGE WITH WARPAGE CONTROL", incorporated herein by reference in its entirety for all purposes.

BACKGROUND OF THE INVENTION

This invention relates generally to semiconductor device package assembly, and in particular to semiconductor die flip chip package assembly. More specifically, the invention relates to an innovative material approach to lower stress and warpage in a laminate flip chip ball grid array (BGA).

In semiconductor device package assembly, a semiconductor die (also referred to as an integrated circuit (IC) chip or "chip") may be bonded directly to a packaging substrate. Such die is formed with bumps of solder affixed to its I/O bonding pads. During packaging, the die is "flipped" onto its front surface (e.g., active circuit surface) so that the solder bumps form electrical and mechanical connections directly between the die and conductive metal pads on the packaging substrate. Underfill is generally applied between the gap formed by the solder bumps in order to further secure the die to the packaging substrate. A heat spreader is then attached over the die and packaging substrate. A semiconductor device package of this type is commonly called a "semiconductor die flip chip package."

A problem with such a semiconductor die flip chip package is that it is subject to different temperatures during the packaging process. For instance, different temperatures arise with the cool down from the solder joining temperature and the underfill curing temperature. As a result, the package is highly stressed due to the different coefficients of thermal expansion (CTE) of the various package and die materials.

The high stress experienced by bonded materials during cooling may cause them to warp or crack and cause the package structure to bow. This problem is exacerbated in the case of a relatively large die, for example one 400 mm² or larger, which has a relatively low CTE, attached to an organic substrate, which has a relatively high CTE. In addition, this problem is exacerbated in the case of a relatively thick die processed from a larger diameter wafer, for example a 300 mm diameter wafer. In some cases, the bow of the package will exceed the co-planarity specification for the semiconductor die flip chip package. With the advent of low-K dice, the high stress caused by the different CTE is even more of a concern. Low-K dielectric material layers in the low-K die are relatively brittle, rendering the low-K die susceptible to failure at even lower stress levels than conventional dice with FSG or USG dielectrics.

Accordingly, what is needed are semiconductor die flip chip packages and packaging methods that control package warpage (e.g., co-planarity) within acceptable limits for incorporation into electronic devices and that redistribute/absorb the package's internal stresses to enhance the reliability of the semiconductor die flip chip package.

SUMMARY OF THE INVENTION

To achieve the foregoing, the present invention provides a semiconductor die flip chip package with warpage control and improved industrial grade reliability. The present invention also provides fabrication methods for such packages. In general, the modulus of the adhesive, which is used to attach the heat spreader to the substrate, is selected to provide a relatively "soft" connection. The packages of the present invention include heat spreaders that are connected to the semiconductor die and packaging substrate with bonds that can withstand and redistribute the considerable bowing pressures caused by the CTE mismatches between the various package and die materials. The result is a semiconductor die flip chip package with less bowing and so improved co-planarity (in compliance with industry specifications) with the surface (e.g., PCB board) to which it is ultimately bound.

In one aspect, the invention relates to a semiconductor device package that includes a die having a back surface and a front surface. The package also includes a substrate having a die side and a board side. Additionally, the package includes a heat spreader coupled to the die side of the substrate with an adhesive having a modulus of not more than about 2 GPa.

In some embodiments, the modulus for the adhesive is less than or equal to 1 GPa. For instance, the modulus for the adhesive is about 0.4 GPa. Typically, the adhesive has a Tg between 30° C. and 70° C. In other embodiments, the heat spreader is coupled to the back surface of the die with a thermal interface material. The thermal interface material has a modulus greater than or equal to that of the adhesive. For instance, the thermal interface material has a modulus about 0.4 GPa.

In general, the heat spreader includes a lid coupled to the back surface of the die with the thermal interface material; and a stiffener coupled to the die side of the substrate with the first adhesive and to the lid with a second adhesive. The second adhesive may have a modulus greater or equal to that of the first adhesive. For instance, the second adhesive has a modulus of about 6 GPa. The second adhesive may have a Tg greater or equal to that of the first adhesive. In some embodiments, the Tg of the second adhesive is equal or greater to 100° C. For instance, the Tg of the second adhesive is about 126° C.

Additionally, in some embodiments, the die is a low-K Si die. Dimensionally, the die is at least 19 mils thick. For instance, the die is about 29 mils thick. Further, the back surface has a surface area of at least 400 mm².

In another aspect, the invention relates to a method of packaging a semiconductor device. The method includes (1) providing a die having a back surface and a front surface; (2) providing a substrate having a die side and a board side; and (3) coupling a heat spreader to the die side of the substrate with an adhesive, the adhesive having a modulus of not more than about 2 GPa.

In yet another aspect, the invention relates to a semiconductor device package that includes a die having a back surface and a front surface; a substrate having a die side and a board side; and means having a modulus of not more than about 2 GPa for coupling a heat spreader to the die side of the substrate.

These and other features and advantages of the invention will be presented in more detail below with reference to the associated drawings.

DETAILED DESCRIPTION OF SPECIFIC EMBODIMENTS

Figure 1:
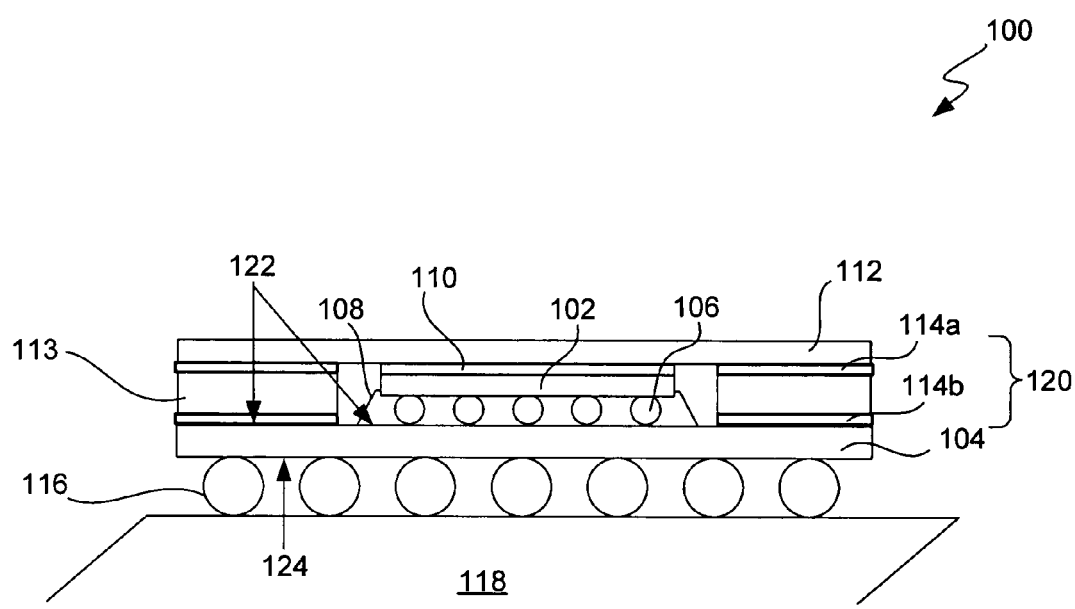
FIG. 1 illustrates a cross-sectional view of a semiconductor device package having a two-piece heat spreader bonded to a substrate according to various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a semiconductor die flip chip package with warpage control and improved industrial grade reliability (e.g., meeting thermal cycling condition B (−55° C. to 125° C.); JESD22-A104; Mil Std 1010). The present invention also provides fabrication methods for such packages. To further elaborate, the packages of the present invention include a heat spreader that is connected to the substrate with a relatively low modulus bond allowing sufficient flexibility to redistribute/absorb the inherent stresses of the CTE mismatch without having various die or package materials (e.g., substrate trace, underfill, etc.) delaminating or cracking during package assembly or industrial grade reliability testing. The bond in combination with other package components (e.g., heat spreader, substrate, etc.) provides a semiconductor die flip chip package with less bowing and so improved co-planarity (in compliance with industry specifications) with the surface (e.g., PCB board) to which it is ultimately bound. The die and package reliabilities are thereby also enhanced, particularly for large/thick die sizes.

Conventional package constructions are inadequate to prevent bowing of packages containing semiconductor dice beyond the co-planarity tolerances of the industry standards. Furthermore, conventional package constructions are inadequate to redistribute/absorb the bowing pressures away from the semiconductor die and to the stronger areas of the package (e.g., stiffeners; substrate). Therefore, a variety of strategies are used in conjunction with the connection of the heat spreader in accordance with the invention. Specific embodiments of the present invention are illustrated and described with reference to FIG. 1.

It should be noted that a heat spreader may either be in a one-piece heat spreader construction or in a two-piece heat spreader construction (e.g., lid and stiffener). That is, a heat spreader may be composed of a lid connected to the substrate via a stiffener or may also have a form that allows for direct attachment to the substrate, such as through edges or legs that descend from the flat piece overlying the die to contact the substrate. Both constructions are referred to herein as a heat spreader.

FIG. 1 illustrates a cross-sectional view of a semiconductor device package having a two-piece heat spreader bonded to a substrate according to various embodiments of the present invention. As shown, a semiconductor die flip chip package 100 having a die (e.g., Si die, low-K Si die, or extra low-K Si die) 102 and substrate 104 are electrically connected by solder bumps 106. The die typically has a CTE of about 2–3 ppm (e.g., 2.6 ppm).

A low-K Si die includes a plurality of layers of low-K dielectric material having a CTE between the range of 20 ppm and 50 ppm. The low-K dielectric material typically has a dielectric constant below that of silicon dioxide and ranges from about 2.6 to 3.5. An extra low-K die includes a plurality of layers of extra low-K dielectric material having a CTE between the range of 10 ppm and 40 ppm along with a dielectric constant between 2.2 and 2.6.

Generally, the plurality of dielectric layers can have any number of low-K or extra low-K materials including, but not limited to: aerogel, xerogel, NANOGLASS® (available from Honeywell, Morristown, N.J.), FLARE™ (available from Honeywell, Morristown, N.J.), SiLK™ (available from The Dow Chemical Company, Midland, Mich.), LKD® (available from JSR Micro, Sunnyvale, Calif.), CORAL® (available from Novellus Systems, Inc., San Jose, Calif.), and Black Diamond™ (available from Applied Materials, Inc., Santa Clara, Calif.). Black Diamond™ typically has a CTE in the range of about 20–23 ppm where SiLK™ has a CTE of about 50 ppm. The overall die CTE remains in the same range as a non-low-K die, about 2–3 ppm (e.g., 2.6 ppm).

Although some semiconductor die flip chip packages (e.g., See U.S. patent application Ser. No. 10/305,671 or Ser. No. 10/719,451) may incorporate a form of warpage control that reduces the amount of warpage to within industry co-planarity specifications and allows an enclosed Si die flip-chip to operate reliably, such packages can be further improved upon. This is especially true in the case of an enclosed low-K (or extra low-K) Si die. This is because many low-K materials are brittle and easily susceptible to cracking or damage under less mechanical or thermal stress (due to CTE mismatches) than that experienced by a conventional Si die. Typically, the low-K materials form a plurality of layers that has a thickness which is $\frac{1}{100}$ (e.g. 5 microns) of the overall low-K Si die thickness (e.g., 500–750 microns). In some cases, the thickness of the plurality of low-K layers is less than 6 microns. Therefore, the present invention is also directed to improve the redistribution of mechanical or thermal stress, caused from the CTE mismatches within the die and package, away from the weaker parts to the stronger parts of the die or package.

Die 102 may have dimensions on the order of about 4–900 mm$^2$ or 19–29 mils thick. As mentioned earlier, the invention is advantageously applied to packages having a large die size, for example, 400 mm$^2$ or larger (e.g., 20×20 mm, 20×23 mm, 22×22 mm, 23×28 mm, or 26×32 mm). Furthermore, the invention is advantageously applied to a thicker die, which is generally produced from a larger diameter wafer (e.g., 29 mil thick die from a 300 mm diameter wafer). This is because larger or thicker dice causes more mechanical stress produced within the dice or packages.

Once the die is chosen, the die may be attached to a substrate. Die 102 and packaging substrate 104 are electrically connected and mechanically bonded in a solder joining operation. The unbonded die has an array of solder bumps arranged on its front surface. The solder is generally composed of a lead material having a melting point of about 300° C., for example. Alternatively, the solder can be a eutectic material having a melting point of about 180° C. or higher (e.g., 183° C.).

Prior to bonding the die to a substrate, solder flux is generally applied to either the front surface of the die or the packaging substrate surface (e.g., die side 122 of substrate 104). The flux serves primarily to aid the flow of the solder, such that the solder bumps make good contact with pre-solder covered metal pads on the packaging substrate. It may be applied in any of a variety of methods, including brushing or spraying, or dipping the die into a thin film, thereby coating the solder bumps with flux. The flux generally has an acidic component, which removes oxide barriers from the solder surfaces, and an adhesive quality, which helps to prevent the die from moving on the packaging substrate surface during the assembly process. Non-cleaning or high temperature cleaning fluxes, as are known in the art, may be used.

After the flux is applied, the die is aligned with and placed onto a placement site on the packaging substrate such that the die's solder bumps are aligned with pre-solder covered metal pads on the die side 122 of substrate 104. The pre-solder covered metal pads are electrically connected to the electrical traces within the substrate. Substrate 104 is typically composed of an organic or laminate material (generally having a CTE of about 15–20 ppm), such as fiberglass, PTFE (such as Teflon™, available form Gore, Eau Claire, Wis.) bismaleimide triazine (BT) resin, epoxy laminates or ceramic-plastic composites. Heat, typically above 200° C. (e.g., 240° C.), is applied to one or more of the die and the packaging substrate, causing the solder bumps 106 to alloy and form electrical connections between die 102 and packaging substrate 104. The package is then cooled to harden the connection. Then, where necessary, the remaining flux residue is substantially removed in a cleaning step, for instance by washing with an appropriate solvent.

An underfill is generally applied in order to enhance the mechanical bonding of the die and substrate. In one embodiment, an underfill material 108, typically a thermo-set epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between the die and the substrate. In a typical procedure, a bead of thermo-set epoxy, is applied along one edge of the die where it is drawn under the die by capillary action until it completely fills the gap between the die and the packaging substrate. Slight heating of the packaging substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any suitable underfill composition (including those incorporating solder flux) application may be used in conjunction with the present invention.

Underfill 108 is cured by heating the substrate and die to an appropriate curing temperature for the underfill material, generally about 150° C., and curing for a specific amount of time at the temperature. In this manner the process produces an electrically and mechanically bonded semiconductor chip assembly, with the underfill material allowing a redistribution of the stress at the connection between the die and the substrate from the solder joints only to the entire substrate-die area. It is important to note that during the cooling down from the underfill cure temperature to the room temperature, large amounts of stress due to the CTE mismatch between the substrate (CTE about 17 ppm) and the die (CTE about 2.6 ppm) may cause the package to warp. In general, warpage is greatest after the underfill is applied.

In accordance with the present invention, a conventional semiconductor die flip chip package construction is improved by the application of a warpage and stress control structure formed by a heat spreader having particular physical bond connection with the die and/or substrate. The warpage and stress control structure may be accomplished in a variety of ways.

To further elaborate, package 100 includes a heat spreader 120 composed of a high modulus (e.g., about 60 to 200 GPa), high thermal conductivity (e.g., about 160 to 400 W/cm-K) material, having substantially the same dimensions as the package substrate. The heat spreader material is typically selected to have a CTE the same as or sufficiently similar to the substrate in order to apply a counter stress to the die and to reduce the bow of the package 100 to within the tolerance of the industry co-planarity specification (about 0.20 mm or 8 mils per JDEC). Typical organic substrate materials have CTEs in the range of about 15–20 ppm, therefore the heat spreader should have a CTE in this range. Moreover, the heat spreader material should have a modulus of elasticity and thickness to balance that of the substrate. Examples of suitable materials include copper; nickel-plated copper; aluminum; and copper alloys (such as Olin194 (ASTM Spec. No. B465), available from Olin Brass, East Alton, Ill.), each with a thickness selected to achieve a balance with the force applied to the front surface of die 102 by substrate 104.

Heat spreader 120 is connected to the back surface of die 102. The connection is provided via a relatively high thermal conductivity thermal interface material (TIM) 110 that creates a relatively solid bond between heat spreader 112 and the back surface of die 102. In one embodiment, thermal interface material 110 includes thermal polymers having a modulus higher than or equal to 100 MPa. In a preferred embodiment, however, thermal interface material product JM2500 (modulus of 0.4 GPa) available from Honeywell, Morristown, N.J. may be used. Alternatively, a thermal interface material product available from Ablestik may be used. Typically, thermal interface material 110 is cured at about 150° C.

Heat spreader 120 is also connected to die side 122 of substrate 104 via stiffener 113. The stiffener (also sometimes referred to as a "picture frame") is typically a flat piece of high modulus metal having substantially the same dimensions as the package substrate with a window in its center to clear the die. The purpose of the stiffener is to constrain the substrate in order to prevent its warpage or other movement relative to the die, which may be caused by thermal cycling (e.g., changes in temperature) during package assembly, reliability testing, or field operation. Such movement may result from the different coefficients of thermal expansion (CTE) of the die and substrate materials, and may produce stress in the die or the package in causing electrical and mechanical failures.

Referring back to FIG. 1, heat spreader 120 is connected to die side 122 of substrate 104 where the connection of lid 112 to stiffener 113 is made with an adhesive 114*a* and the connection of stiffener 113 to substrate 104 is made with an adhesive 114*b*. Adhesives 114*a* and 114*b* have a relatively low modulus to allow for some flexibility in the overall connection between heat spreader 120 and substrate 104. Generally, low modulus adhesives for this purpose are silicone-based adhesives. In one embodiment, adhesives 114*a* and 114*b* include having a modulus lower than or equal to 2 GPa. In another embodiment, they have a modulus lower than or equal to 1 GPa. In a preferred embodiment, product JM2500 (modulus of 0.4 GPa) available from Honeywell, Morristown, N.J. may be used. Furthermore, adhesive 114a and 114b may have an associated glass transition temperature Tg in the range between 30° C. and 70° C.

Although adhesives 114a and 114b can be the same material or at least embody some of the same characteristics described herein, another embodiment allows them to be different. For example, adhesive 114a may have a modulus greater than that of adhesive 114b, such as where adhesive 114a has a modulus of about 6 GPa and where adhesive 114b has a modulus of about 0.4 GPa. In addition, adhesive 114a may have a Tg greater than that of adhesive 114b. In one embodiment, adhesive 114a may have a Tg equal or greater to 100° C., such as about 126° C. Generally, adhesives are cured at about 150° C.

The relatively low modulus material bond (e.g., adhesive 114a, 114b) between heat spreader 112 and substrate 104 allows for sufficient flexibility to accommodate (e.g., redistribute/absorb) the inherent stresses of the CTE mismatch (thereby reducing the risk of delaminating and cracking of the die, underfill, or substrate) while applying appropriate force to prevent bowing of the package outside the industry specifications. In this construction, the forces generated by the CTE mismatch are absorbed by the bond and/or redistributed away from the die and toward the stronger portions of the package (e.g., stiffeners; substrate). As a result, semiconductor die flip chip package 100 may be more reliably used and more reliably connected to a printed circuit board 118 via a ball grid array (BGA) of solder balls 116 on the board side 124 of substrate 104.

Figure 2:
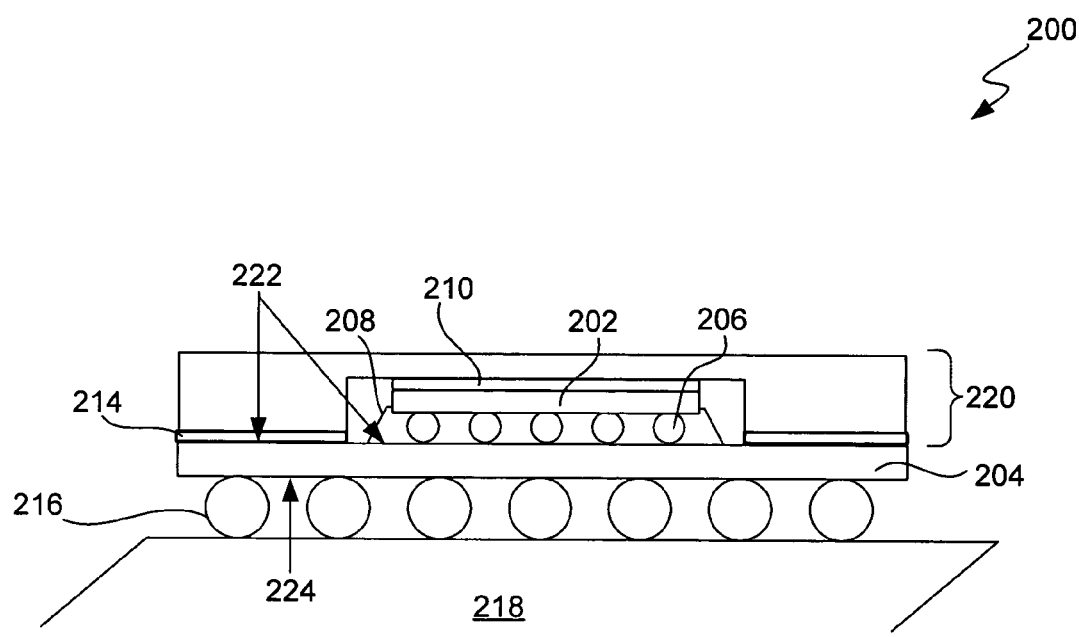
FIG. 2 illustrates a cross-sectional view of a semiconductor device package having a one-piece heat spreader bonded to a substrate according to various embodiments of the present invention.

FIG. 2 illustrates a cross-sectional view of a semiconductor device package having a one-piece heat spreader bonded to a substrate according to various embodiments of the present invention. Similar to semiconductor die flip chip package 100 of FIG. 1, semiconductor die flip chip package 200 uses many of the same techniques and mechanisms in forming the warpage and stress control structure of the present invention. Moreover, it will be appreciated by those skilled in the art that many of the components in forming semiconductor die flip chip package 100 are interchangeable with those in forming semiconductor die flip chip package 200.

As shown, a die 202 is attached to a substrate 204 via solder bumps 206. An underfill 208 is injected in the gap between die 202 and substrate 204. A one-piece heat spreader 220 is attached to the die side 222 of substrate 204 with an adhesive 214 having a modulus of no more than about 2 GPa. Heat spreader 220 is also generally attached to the back surface of die 202 with a thermal interface material 210. In one embodiment, thermal interface material 210 has a modulus greater than or equal to that of adhesive 214.

Thermal interface material 210 generally includes thermal polymers having a modulus higher than or equal to 100 MPa. In a preferred embodiment, however, thermal interface material product JM2500 (modulus of 0.4 GPa) available from Honeywell, Morristown, N.J. may be used. Alternatively, thermal interface material product (modulus of about 0.4 GPa) available from Ablestik may be used. Typically, thermal interface material 210 is cured at about 150° C. The low modulus adhesives for this purpose are generally silicone-based adhesives. In one embodiment, adhesive 214 includes having a modulus lower than or equal to 2 GPa. In another embodiment, a modulus lower than or equal to 1 GPa is used. In a preferred embodiment, product JM2500 (modulus of 0.4 GPa) available from Honeywell, Morristown, N.J. may be used. Furthermore, adhesive 214 may have an associated glass transition temperature Tg in the range between 30° C. and 70° C. The combination of adhesive 214 with various package components (e.g., thermal interface material 210) facilitates the balancing of stresses resulting from the package's CTE mismatches.

According to various embodiments, die 202 is encapsulated by heat spreader 220 and substrate 204. However, it should be noted that heat spreader 220 may cover any portion of die 202. For instance, heat spreader 220 may be in a channel type shape where some ends of die 202 are not covered. In order to electrically connect semiconductor die flip chip package 200 to a board surface 218, a BGA of solder balls 216 is attached to the board side 224 of substrate 204. The reflowing of solder balls 216 is typically done at about 220° C.–240° C.

EXAMPLE

The following example provides modeling results for a semiconductor die flip chip package with warpage control in accordance with specific embodiments of the present invention. It should be understood the following is representative only, and that the invention is not limited by the detail set forth in this example.

A Stratix 1S60-F1020 die (e.g., 20 mm×22 mm die), available from Altera, Inc. of San Jose was selected along with a 33 mm×33 mm 6-layer build up organic substrate, available from Kyocera of Kyoto, Japan, in modeling a semiconductor die flip chip package in accordance to the present invention. The die had a CTE of about 2.6 ppm whereas the substrate had a CTE of about 17 ppm. The semiconductor die flip chip package was subjected to modeled warpage testing and to modeled reliability testing (e.g., industrial grade reliability test of thermal cycling condition B (−55° C. to 125° C.); JESD22-A104; Mil Std 1010) under different modeling arrangements to determine their conformance thereof. The different modeling arrangements along with their corresponding package stress and warpage measurements were recorded in the following table.

|  | Stiffener-Substrate Adhesive | Stiffener-Lid Adhesive | Substrate Von Mises | Underfill Shear | LK Shear | LK S1 | Warpage ($\mu$m) |
|---|---|---|---|---|---|---|---|
| Current | Ablestik 3003 | Ablestik 3003 | 77 MPa | 43.5 MPa | 50.2 MPa | 91.6 MPa | 125.9 |
| Proposal 1 | JM2500 | JM2500 | 61.7 MPa | 37.6 MPa | 41.6 MPa | 78.1 MPa | 123 |
| Proposal 2 | JM2500 | Hysol 1016 | 59.7 MPa | 37.4 MPa | 40 MPa | 76.8 MPa | 96.5 |

Modeled warpage testing for such packages generally involves simulating industry available and accepted co-planarity standards, such as JEDEC specification MS-034. In practice, however, measuring the warpage or bow involves using a commercially available warpage or bow measuring tool. For example, RVSI Models LS7700, LS3700, and LS7350 DB, available from Robotic Vision Systems, Inc. of Nashua, N.H. may be used. Generally, warpage testing is conducted and measured after the semiconductor die flip chip package has been formed and before the semiconductor die flip chip package is subjected to reliability testing.

Similarly, modeled reliability testing for such packages generally involves simulating industry available and accepted reliability testing standards such as those established by the Electronic Industries Association (EIA) or the Joint Electron Device Engineering Council (JEDEC). For example, JESD22-A104 and Mil Std 1010. In one embodiment, simulated industrial grade reliability testing is performed and includes cycling the temperature between −55° C. to 125° C. and/or running 1000 cycles. Temperature cycling is conducted to determine the resistance of the die to high and low temperature extremes. This environmental stress test is designed to simulate the extensive changes in temperature to which the die and the package may be exposed. Typically, to pass the test, the die, layers of low-K material, substrate, underfill, and/or other package components should not show signs of damage such as cracking, chipping, delaminating, or breaking.

Referring to the first modeling arrangement (Proposal 1) listed in the table, which is a preferred embodiment, a heat spreader was attached to the substrate where the stiffener-to-substrate adhesive (e.g., 114b) was JM2500 and where the stiffener-to-lid adhesive (e.g., 114a) was also JM2500. JM2500 has a relatively low modulus of 0.4 GPa. The results indicated a Substrate Von Mises of 61.7 MPa, Underfill Shear of 37.7 MPa, LK (Low K) Shear of 41.6 MPa, and LK First Principle (S1) of 78.1 MPa. Overall, this first modeling arrangement provided a conforming package warpage measurement (123 μm) that came well within the required 8 mils (203 μm) co-planarity specification and provided the best conforming (e.g., passing) die and package reliability results under modeled reliability testing.

As seen from the table above, another modeling arrangement (Proposal 2) was provided. The second modeling arrangement also comprised of a two-piece heat spreader where the stiffener-to-substrate adhesive (e.g., 114b) was JM2500 and where the stiffener-to-lid adhesive (e.g., 114a) was Hysol 1016. Hysol® 1016 (available from Henkel Loctite Corporation, Rocky Hill, Conn.) has a modulus of about 5.9 GPa. In this specific modeling arrangement, the results indicated a Substrate Von Mises of 59.7 MPa, Underfill Shear of 37.4 MPa, LK Shear of 40 MPa, and LK S1 of 76.8 MPa. Again, a low warpage (i.e., 96.5 μm) measurement and an industrial grade modeled reliability testing result that was nearly as successful as to that of the first modeling arrangement were achieved.

Both the above arrangements (proposals 1 and 2) provided modeling results that were overall lower than those of a currently implemented solution. As shown, the current solution involves using Ablestik 3003 as both the stiffener-to-substrate adhesive and the stiffener-to-lid adhesive. It is important to note that Ablestik (Ablebond) 3003 (available from Ablestik Laboratories of Rancho Domingo, Calif.) has a modulus of 4 GPa, which is substantially higher and "harder" than the adhesives used in proposals 1 and 2. As a result, proposals 1 and 2 implement a "softer" connection and are improvements to the current solution in reducing the package stress and package warpage. The "softer" connection allows an improve balancing of the stresses resulting from the CTE mismatches of various package and die materials.

CONCLUSION

The foregoing invention presents many advantages over conventional flip chip packages. For example, the ability to use organic substrates instead of ceramic substrates facilitates in lowering costs, improving electrical performance, and reducing board level reliability problems. Another advantage is that the foregoing invention provides a packaging solution for low-K and future extra low-K Si dice. The material bond between the heat spreader and the substrate allows sufficient flexibility to redistribute/absorb the stresses caused by the CTE mismatches of the various materials in the die and package; thereby, providing a semiconductor die flip chip package with less bowing and so improved co-planarity (in compliance with industry specifications) with the surface (e.g., PCB board) to which it is ultimately bound.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor device package, comprising:
a die having a back surface and a front surface;
a substrate having a die side and a board side; and
a heat spreader coupled to the die side of the substrate with an adhesive, the adhesive having an elastic modulus of not more than about 2 GPa and a Tg between 30° C. and 70° C.

2. The package of claim 1, wherein the elastic modulus for the adhesive is less than or equal to 1 GPa.

3. The package of claim 1, wherein the elastic modulus for the adhesive is about 0.4 GPa.

4. The package of claim 1, wherein the heat spreader is also coupled to the back surface of the die with a thermal interface material.

5. A semiconductor device package, comprising:
a die having a back surface and a front surface;
a substrate having a die side and a board side; and
a heat spreader coupled to the die side of the substrate with an adhesive, the adhesive having an elastic modulus of not more than about 2 GPa, wherein the heat spreader is also coupled to the back surface of the die with a thermal interface material, wherein the thermal interface material has a modulus greater than or equal to that of the adhesive.

6. A semiconductor device package, comprising:
a die having a back surface and a front surface;
a substrate having a die side and a board side; and
a heat spreader coupled to the die side of the substrate with an adhesive, the adhesive having an elastic modulus of not more than about 2 GPa, wherein the heat spreader is also coupled to the back surface of the die with a thermal interface material, wherein the thermal interface material has an elastic modulus about 0.4 GPa.

7. The package of claim 6, wherein the heat spreader comprises:

a lid coupled to the back surface of the die with the thermal interface material; and a stiffener coupled to the die side of the substrate with the first adhesive and to the lid with a second adhesive.

8. The package of claim 7, wherein the second adhesive has an elastic modulus greater or equal to that of the first adhesive.

9. The package of claim 8, wherein the second adhesive has an elastic modulus of about 6 GPa.

10. The package of claim 7, wherein the second adhesive has a Tg greater or equal to that of the first adhesive.

11. The package of claim 10, wherein the Tg of the second adhesive is equal or greater to 100° C.

12. The package of claim 10, wherein the Tg of the second adhesive is about 126° C.

13. A semiconductor device package, comprising:
a die having a back surface and a front surface, wherein the die is a low-K Si die;
a substrate having a die side and a board side; and
a heat spreader coupled to Fe die side of the substrate with an adhesive, the adhesive having an elastic modulus of not more than about 2 GPa.

14. A semiconductor device package, comprising:
a die having a back surface and a front surface, wherein the die is at least 19 mils thick;
a substrate having a die side and a board side; and
a heat spreader coupled to the die side of the substrate with an adhesive, the adhesive having an elastic modulus of not more than about 2 GPa.

15. A semiconductor device package, comprising:
a die having a back surface and a front surface, wherein the die is about 29 mils thick;
a substrate having a die side and a board side; and
a heat spreader coupled to the die side of the substrate with an adhesive, the adhesive having an elastic modulus of not more than about 2 GPa.

16. A semiconductor device package, comprising:
a die having a back surface and a front surface, wherein the back surface has a surface area of at least 400 mm$^2$:
a substrate having a die side and a board side; and
a heat spreader coupled to the die side of the substrate with an adhesive, the adhesive having an elastic modulus of not more than about 2 GPa.

17. A method of packaging a semiconductor device, comprising:
providing a die having a back surface and a front surface;
providing a substrate having a die side and a board side; and
coupling a heat spreader to the die side of the substrate with an adhesive, the adhesive having an elastic modulus of not more than about 2 GPa and a Tg between 30° C. and 70° C.

18. The method of claim 17, wherein the elastic modulus for the adhesive is less than or equal to 1 GPa.

19. The method of claim 17, wherein the elastic modulus for the adhesive is about 0.4 GPa.

20. The method of claim 17, further comprising coupling the heat spreader to the back surface of the die with a thermal interface material.

21. A method of packaging a semiconductor device, comprising:
providing a die having a back surface and a front surface;
providing a substrate having a die side and a board side;
coupling a heat spreader to the die side of the substrate with an adhesive, the adhesive having an elastic modulus of not more than about 2 GPa; and
coupling the heat spreader to the back surface of the die with a thermal interface material, wherein the thermal interface material has a modulus greater than or equal to that of the adhesive.

22. A method of packaging a semiconductor device, comprising:
providing a die having a back surface and a front surface;
providing a substrate having a die side and a board side;
coupling a heat spreader to the die side of the substrate with an adhesive, the adhesive having an elastic modulus of not more than about 2 GPa; and
coupling the heat spreader to the back surface of the die with a thermal interface material, wherein the thermal interface material has an elastic modulus about 0.4 GPa.

23. The method of claim 22, wherein coupling the heat spreader comprises:
coupling a lid to the back surface of the die with the thermal interface material; and
coupling a stiffener to the die side of the substrate with the first adhesive and to the lid with a second adhesive.

24. The method of claim 23, wherein the second adhesive has an elastic modulus greater or equal to that of the first adhesive.

25. The method of claim 24, wherein the second adhesive has an elastic modulus of about 6 GPa.

26. The method of claim 23, wherein the second adhesive has a Tg greater or equal to that of the first adhesive.

27. The method of claim 26, wherein the Tg of the second adhesive is equal or greater to 100° C.

28. The method of claim 26, wherein the Tg of the second adhesive is about 126° C.

29. A method of packaging a semiconductor device, comprising:
providing a die having a back surface and a front surface, wherein the die is a low-K Si die;
providing a substrate having a die side and a board side; and
coupling a heat spreader to the die side of the substrate with an adhesive, the adhesive having an elastic modulus of not more than about 2 GPa.

30. A method of packaging a semiconductor device, comprising:
providing a die having a back surface and a front surface, wherein the die is at least 19 mils thick;
providing a substrate having a die side and a board side; and
coupling a heat spreader to the die side of the substrate with an adhesive, the adhesive having an elastic modulus of not more than about 2 GPa.

31. A method of packaging a semiconductor device, comprising:
providing a die having a back surface and a front surface, wherein the die is about 29 mils thick;
providing a substrate having a die side and a board side; and
coupling a heat spreader to the die side of the substrate with an adhesive, the adhesive having an elastic modulus of not more than about 2 GPa.

32. A method of packaging a semiconductor device, comprising:
providing a die having a back surface and a front surface, wherein the back surface has a surface area of at least 400 mm$^2$;
providing a substrate having a die side and a board side; and coupling a heat spreader to the die side of the substrate with an adhesive, the adhesive having an elastic modulus of not more than about 2 GPa.

33. A semiconductor device package, comprising:

a die having a back surface and a front surface;

a substrate having a die side and a board side; and means having an elastic modulus of not more than about 2 GPa and a Tg between 30° C. and 70° C. for coupling a heat spreader to the die side of the substrate.

* * * * *